United States Patent
Yang et al.

(10) Patent No.: US 9,644,895 B2
(45) Date of Patent: May 9, 2017

(54) HEATER MOVING TYPE SUBSTRATE PROCESSING APPARATUS

(71) Applicant: EUGENE TECHNOLOGY CO., LTD., Gyeonggi-do (KR)

(72) Inventors: Il-Kwang Yang, Gyeonggi-do (KR); Byoung-Gyu Song, Gyeonggi-do (KR); Kyong-Hun Kim, Gyeonggi-do (KR); Yong-Ki Kim, Chungcheongnam-do (KR); Yang-Sik Shin, Gyeonggi-do (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 226 days.

(21) Appl. No.: 14/385,511

(22) PCT Filed: Apr. 3, 2013

(86) PCT No.: PCT/KR2013/002773
§ 371 (c)(1),
(2) Date: Sep. 16, 2014

(87) PCT Pub. No.: WO2013/154297
PCT Pub. Date: Oct. 17, 2013

(65) Prior Publication Data
US 2015/0044622 A1    Feb. 12, 2015

(30) Foreign Application Priority Data

Apr. 10, 2012    (KR) .................. 10-2012-0037299

(51) Int. Cl.
*H05B 3/68*    (2006.01)
*F27D 19/00*    (2006.01)
(Continued)

(52) U.S. Cl.
CPC .............. *F27D 19/00* (2013.01); *C23C 16/46* (2013.01); *C30B 25/10* (2013.01); *C30B 33/12* (2013.01);
(Continued)

(58) Field of Classification Search
CPC .......................... C23C 18/1678; C23C 16/46; H01L 21/67098
(Continued)

(56) References Cited

U.S. PATENT DOCUMENTS 5,215,619 A * 6/1993 Cheng ............... H01J 37/32477
118/724
5,854,468 A * 12/1998 Muka ................ H01L 21/67109
204/298.25
(Continued)

FOREIGN PATENT DOCUMENTS

JP    H 07321097 A    12/1995
JP    2002-313730 A    10/2002
(Continued)

OTHER PUBLICATIONS

Chinese Office Action dated Mar. 2, 2016.

*Primary Examiner* — Gregory A Wilson
(74) *Attorney, Agent, or Firm* — Rabin & Berdo, P.C.

(57) ABSTRACT

Provided is a substrate processing apparatus. The substrate processing apparatus includes a chamber providing an inner space in which a process with respect to a substrate is performed, a heating plate on which the substrate is placed, the heating plate being fixedly disposed within the chamber, a heater spaced from a lower portion of the heating plate to heat the heating plate, and a lift module lifting the heater.

11 Claims, 3 Drawing Sheets

(51) Int. Cl.
  *F27D 7/02*      (2006.01)
  *F27D 7/06*      (2006.01)
  *H01L 21/67*     (2006.01)
  *H01L 21/687*    (2006.01)
  *C23C 16/46*     (2006.01)
  *C30B 25/10*     (2006.01)
  *C30B 33/12*     (2006.01)
  *C30B 35/00*     (2006.01)

(52) U.S. Cl.
  CPC ............... *C30B 35/00* (2013.01); *F27D 7/02* (2013.01); *F27D 7/06* (2013.01); *H01L 21/67109* (2013.01); *H01L 21/68742* (2013.01); *F27D 2007/066* (2013.01); *F27D 2019/0028* (2013.01)

(58) Field of Classification Search
  USPC ........ 432/253, 258; 219/443.1, 449.1, 451.1, 219/453.11
  See application file for complete search history.

(56) References Cited

U.S. PATENT DOCUMENTS

| | | | |
|---|---|---|---|
| 6,307,184 B1 * | 10/2001 | Womack | H01L 21/67109 118/724 |
| 7,381,291 B2 | 6/2008 | Tobe et al. | |
| 8,790,489 B2 * | 7/2014 | Honda | H01J 37/18 118/715 |
| 8,837,924 B2 * | 9/2014 | Tsunekawa | H01L 21/67109 118/724 |
| 9,312,154 B2 * | 4/2016 | Tran | C23C 16/4401 |
| 2002/0017363 A1 * | 2/2002 | Nakashima | C23C 16/4584 156/345.12 |
| 2006/0021701 A1 | 2/2006 | Tobe et al. | |
| 2006/0075972 A1 | 4/2006 | Nakashima et al. | |
| 2008/0233669 A1 * | 9/2008 | Hirakata | H01L 51/5265 438/35 |
| 2012/0000886 A1 | 1/2012 | Honda et al. | |
| 2012/0055916 A1 * | 3/2012 | Volfovski | H05B 3/68 219/443.1 |
| 2012/0193071 A1 * | 8/2012 | Tsunekawa | H01L 21/67109 165/61 |

FOREIGN PATENT DOCUMENTS

| | | |
|---|---|---|
| JP | 2002-317269 A | 10/2002 |
| JP | 2007-059782 A | 3/2007 |
| KR | 10-2006-0053855 A | 5/2006 |
| KR | 10-2011-0081691 A | 7/2011 |
| KR | 10-2011-0084616 A | 7/2011 |
| KR | 10-2010-0013592 A | 2/2012 |

\* cited by examiner

HEATER MOVING TYPE SUBSTRATE PROCESSING APPARATUS

BACKGROUND OF THE INVENTION

The present invention disclosed herein relates to a substrate processing apparatus, and more particularly, to a substrate processing apparatus in which a heater is lifted to control a temperature of a substrate.

Ordinary selective epitaxy processes involve deposition reaction and etching reaction. The deposition and etching reactions may occur simultaneously at slightly different reaction rates with respect to a polycrystalline layer and an epitaxial layer. While an existing polycrystalline layer and/or amorphous layer are/is deposited on at least one second layer during the deposition process, the epitaxial layer is formed on a surface of a single crystal. However, the deposited polycrystalline layer is etched faster than the epitaxial layer. Thus, corrosive gas may be changed in concentration to perform a net selective process, thereby realizing the deposition of an epitaxial material and the deposition of a limited or unlimited polycrystalline material. For example, a selective epitaxy process may be performed to form an epilayer formed of a silicon-containing material on a surface of single crystal silicon without leaving the deposits on a spacer.

Generally, the selective epitaxy process has several limitations. To maintain selectivity during the selective epitaxy process, a chemical concentration and reaction temperature of a precursor should be adjusted and controlled over the deposition process. If an insufficient silicon precursor is supplied, the etching reaction is activated to decrease the whole process rate. Also, features of the substrate may be deteriorated with respect to the etching. If an insufficient corrosive solution precursor is supplied, selectivity for forming the single crystalline and polycrystalline materials over the surface of the substrate may be reduced in the deposition reaction. Also, typical selective epitaxy processes are performed at a high reaction temperature of about 800° C., about 1,000° C., or more. Here, the high temperature is unsuited for the manufacturing process due to uncontrolled nitridation reaction and thermal budge on the surface of the substrate.

SUMMARY OF THE INVENTION

The present invention provides a substrate processing apparatus in which a heater is lifted to control a temperature of a substrate.

Further another object of the present invention will become evident with reference to following detailed descriptions and accompanying drawings.

Embodiments of the present invention provide substrate processing apparatuses including: a chamber providing an inner space in which a process with respect to a substrate is performed; a heating plate on which the substrate is placed, the heating plate being fixedly disposed within the chamber; a heater spaced from a lower portion of the heating plate to heat the heating plate; and a lift module lifting the heater.

In some embodiments, the substrate processing apparatuses may further include a discharge plate disposed around the heating plate, wherein the discharge plate may be disposed under a substrate entrance passage defined in the chamber.

In other embodiments, the substrate processing apparatuses may further include a plurality of support bars disposed under the discharge plate to support the discharge plate.

In still other embodiments, the discharge plate may be fixedly disposed on an inner wall of the chamber to support the heating plate.

In even other embodiments, the substrate processing apparatuses may further include an auxiliary discharge plate spaced from a lower portion of the discharge plate, the auxiliary discharge plate being fixedly disposed on the inner wall of the chamber.

In yet other embodiments, the substrate processing apparatuses may further include: a support shaft connected to a lower portion of the heater to support the heater; a lower fixing ring fixedly disposed on a lower portion of the support shaft; and a driving part lifting the lower fixing ring.

In further embodiments, the substrate processing apparatuses may further include: an upper fixing ring fixedly disposed on a lower wall of the chamber; and a bellows connecting the upper fixing ring to the lower fixing ring to maintain an inner space of the chamber in a vacuum state.

In still further embodiments, the substrate processing apparatuses may further include: a support shaft connected to a lower portion of the heater to support the heater; a driving part lifting the support shaft; and a control part controlling the driving part according to a heating temperature inputted into the heater to adjust a distance spaced between the heating plate and the heater.

In yet further embodiments, the substrate processing apparatuses may further include a plurality of lift pins fixedly disposed on a top surface of the heating plate to support the substrate thereon.

In much further embodiments, the substrate processing apparatuses may further include: a chamber body having an opened upper portion, the chamber body having a passage, through which the substrate is loaded or unloaded, in a side thereof; a chamber cover covering the opened upper portion of the chamber body; and an exhaust port disposed on a sidewall of the chamber body.

In still much further embodiments, the substrate processing apparatuses may further include: a chamber body having an opened upper portion, the chamber body having a passage, through which the substrate is loaded or unloaded, in a side thereof; a chamber cover covering the opened upper portion of the chamber body; a lower port connected to an opened lower portion of the chamber body; and an exhaust port disposed on the lower port.

In even much further embodiments, the substrate processing apparatuses may further include: a chamber body having an opened upper portion, the chamber body having a passage, through which the substrate is loaded or unloaded, in a side thereof; a chamber cover covering the opened upper portion of the chamber body; a gas supply hole defined in an upper portion of the chamber cover to supply a first gas; an antenna disposed to surround a circumference of the chamber cover to form a magnetic field within the chamber cover, thereby generating plasma from the first gas; and an injection ring fixedly disposed between the chamber body and the chamber cover to supply a second gas.

In yet much further embodiments, the substrate processing apparatuses may further include: a first shower head disposed above the injection ring, the first shower head having a plurality of first injection holes; and a second shower head disposed under the injection ring, the second shower head having a plurality of second injection holes.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
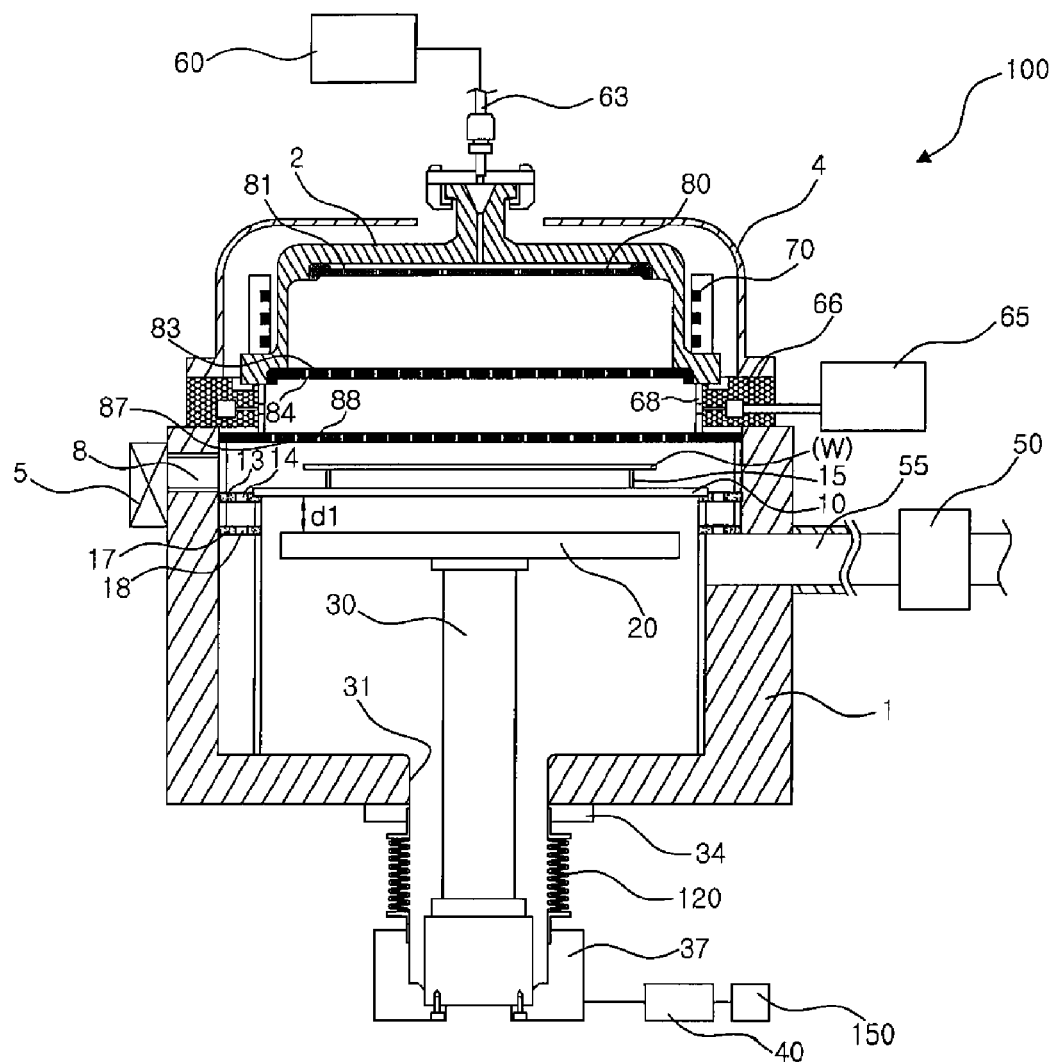
FIG. 1 is a schematic view of a substrate processing apparatus according to an embodiment of the present invention.

Hereinafter, exemplary embodiments of the present invention will be described in detail with reference to FIGS. 1 to 3. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration. Although an oxide layer removal process (cleaning process) is described below as an example, the present invention may be applied to various semiconductor manufacturing processes including the deposition process. Also, although an inductively coupled plasma (ICP) process is exemplified as a plasma generation process described in embodiments, the plasma generation process may be applied to various plasma processes. Also, the plasma generation process may be performed on various objects to be processed in addition to a substrate W described in embodiments.

FIG. 1 is a schematic view of a substrate processing apparatus according to an embodiment of the present invention. Referring to FIG. 1, a substrate processing apparatus 100 includes a chamber body 1 and a chamber cover 2. Also, processes with respect to a substrate W are performed within the substrate processing apparatus 100. The chamber body 1 has an opened upper portion and a passage 8 defined in one side thereof. The substrate W is loaded into or unloaded from a chamber through the passage 8 defined in the one side of the chamber body 1. A gave valve 5 is disposed outside the passage 8. The passage 8 may be opened or closed by the gate valve 5. Also, the chamber body 1 may have a structure which is opened toward a lower side thereof through a through-hole 31 defined in a bottom surface thereof.

The substrate W is moved into the substrate processing apparatus 100 through the passage 8 and then is seated on a lift pin 15 supporting the substrate W. The lift pin 15 may be integrated with an upper end of a heating plate 10. Also, a plurality of lift pins 15 may be provided to stably support the substrate W. Also, the lift pins 15 may maintain a distance between the substrate W and the heating plate 10 at a predetermined height. Thus, the distance between the substrate W and the heating plate 10 may be varied according to the height of the lift pin 15.

The heating plate 10 is connected to a lower end of the lift pin 15, and the lift pins 15 stably support the substrate W disposed thereon. Also, the heating plate 10 transfers heat supplied from a heater 20 disposed spaced from a lower portion thereof into the substrate W. The heating plate 10 may have an area greater than that of the heater 20 to uniformly transfer the heat supplied from the heater 20 into the substrate W. Also, the heating plate 10 may have a circular disk shape corresponding to that of the substrate W. Also, the heating plate 10 may be formed of a material having superior thermal conductivity and less deformed at a high temperature. The heating plate 10 may be quartz or a material coated with quartz.

The heater 20 is disposed spaced from the lower portion of the heating plate 10 to apply heat into the substrate W through the heating plate 10. The heater 20 receives current from an external power source (not shown) to generate heat. A lift module is disposed on a lower portion of the heater 20. The lift module lifts the heater 20. Thus, a heating temperature of the substrate W may be adjusted according to a lifted degree of the heater 20.

When the substrate W is heated at a second heating temperature greater than a first heating temperature, an output of the heater 20 may be increased to increase the heating temperature. However, when the substrate W is heated at a second heating temperature less than a first heating temperature, it may be difficult to easily decrease the heating temperature of the heater 20 due to heat remaining in the heater 20 even though an output of the heater 20 is decreased. Thus, it takes a delay time to cool the heater 20. As a result, a process time may be delayed.

Also, the above-described method corresponds to a case in which the first and second heating temperatures are satisfied within one chamber. However, when first and second heating are performed through separate chambers, the substrate W may be contaminated due to the movement thereof, and also moving time may be required.

Thus, the heater 20 may be lifted by a driving part 40 to adjust a distance spaced between the heating plate 10 (or the substrate W) and the heater 20, thereby easily and quickly adjusting the heating temperature of the substrate W. This may be described through a principle in which a heat transfer amount from the heater 20 into the heating plate 10 (or the substrate W) is inversely proportional to the spaced distance therebetween. Although the heater 20 is lifted in the current embodiment, the present invention is not limited thereto. For example, the heating plate 10 or the lift pin 15 may be lifted to adjust the spaced distance. As a result, the heating temperature of the substrate W may be easily adjusted.

The lift module is disposed under the heater 20. The lift module includes a support shaft 30 for lifting the heater 20, a lower fixing ring 37, and the driving part 40. The support shaft 30 is disposed on a lower end of the heater 20 to stably support the heater 20. The support shaft 30 may have a cylindrical shape. Also, the support shaft 30 may be vertically moved together with the heater 20. The lower fixing ring 37 is disposed on a lower end of the support shaft 30. The lower fixing ring 37 may have a ring shape surrounding the lower end of the support shaft 30. The lower fixing ring 37 is lifted by the driving part 40. As the lower fixing ring 37 is lifted, the support shaft 30 and the heater 20 are lifted together with the lower fixing ring 37. The driving part 40 may be a motor transmitting a power. The lower fixing ring 37 may be lifted by rotation of the motor. To lift the lower fixing ring 37 by the driving part 40, various methods for lifting a rail or elevator shaft and the lower fixing ring 37 in addition to the motor may be utilized. Also, the driving part 40 is connected to a control part 150. The control part 150 controls the driving part 40 according to a heating temperature inputted into the heater 20 to lift the heater 20.

A process for adjusting the heating temperature of the substrate W by lifting the heater 20 will be described with reference to FIGS. 1 and 2. FIG. 2 is a schematic view illustrating a state in which the heater of FIG. 1 descends.

As shown in FIG. 1, the heater 20 is disposed spaced from the lower portion of the heating plate 10. Here, a distance spaced between the heater 20 and the heating plate 10 is defined as a reference symbol $d_1$, and a temperature of the heater 20 is defined as a reference symbol T. Also, a heat transfer amount into the heating plate 10 is defined as a reference symbol $Q_1$. A first process may be performed in a state where the substrate W is heated at a predetermined temperature.

Figure 2:
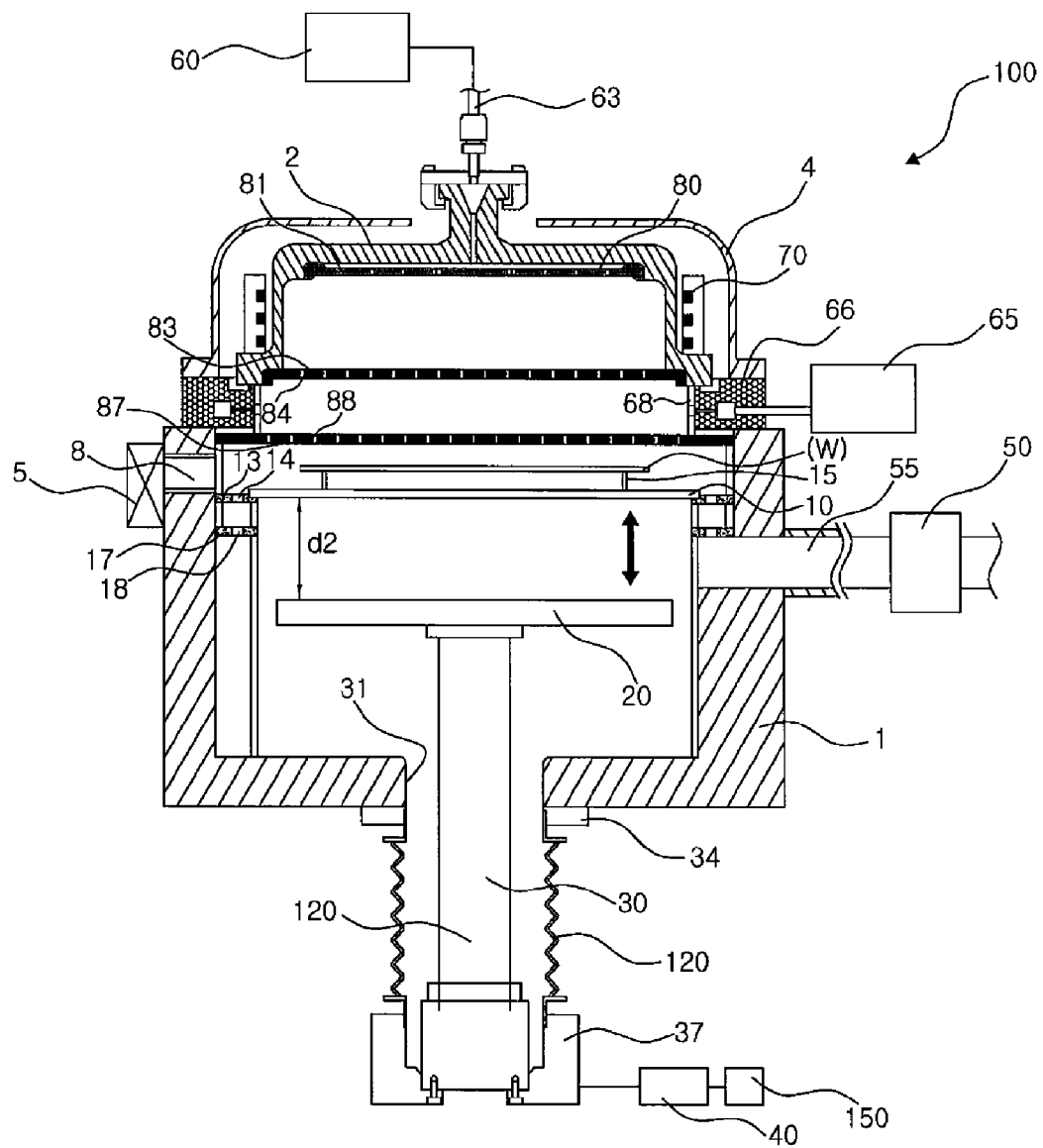
FIG. 2 is a schematic view illustrating a state in which a heater of FIG. 1 descends.

Thereafter, when a second process is performed at a heating temperature less than that of the first process, as shown in FIG. 2, the heater 20 descends by the driving part 40. Thus, as the heater 20 and the heating plate 10 are spaced from each other by a distance $d_2$ ($<d_1$), the heater 20 descends in a state where a preset heating temperature of the heater 20 is maintained at the same temperature as T. As a result, thermal energy transferred into the heating plate 10 may become $Q_2$ ($<Q_1$). Here, the second process may be performed on the substrate W at a heating temperature less than that of the first process. In this case, the heater 20 may descend to easily and quickly decrease the heating temperature.

On the other hand, when the second process is performed at a heating temperature greater than that of the first process, the heater 20 ascends by the driving part 40. Thus, as the heater 20 and the heating plate 10 are spaced from each other by a distance $d_2$ ($>d_1$), the heater 20 ascends in a state where a heating temperature of the heater 20 is maintained at the same temperature as T. As a result, thermal energy transferred into the heating plate 10 may become $Q_2$ ($>Q_1$). Here, the second process may be performed on the substrate W at a heating temperature greater than that of the first process. On the other hand, as described above, the heater 20 may be increased in output to increase a temperature T of the heater 20. When the second heating temperature is significantly greater than the first heating temperature, the increase of the output of the heater 20 may be effective. When the second heating temperature is slightly greater than the first heating temperature, a method in which the heater 20 is lifted to adjust the heating temperature may be advantage in an aspect of a required time or uniformity of the heating temperature.

As shown in FIG. 1, a discharge plate 13 is disposed on a side surface of a lower end of the heating plate 10. The discharge plate 13 may be formed of quartz. The discharge plate 13 is disposed along a circumference of the heating plate 10. Also, the discharge plate 13 is fixedly disposed on an inner wall of the chamber body 1. Also, the discharge plate 13 may be disposed under the passage 8 and have a circular ring shape. After a cleaning process is finished, a non-reaction gas or reaction product which will be described later is moved in a direction of a exhaust port 55 along a discharge hole 14 defined in an inner circumference surface of the discharge plate 13. Also, an auxiliary discharge plate 17 may be further provided. The auxiliary discharge plate 17 is spaced from a lower portion of the discharge plate 13 and has a circular ring shape. Also, a support bar 18 is disposed under the discharge plate 13 to support the discharge plate 13 and the auxiliary discharge plate 17. The support bar 18 may be provided in plurality and be formed of a quartz material. In addition, as the heater 20 is lifted to approach the bottom surface of the chamber body, an insulation plate (not shown) for protecting the chamber body may be disposed around a lifting part of the heater.

A bellows 120 for allowing an internal atmosphere to be maintained in a vacuum state and blocking an external atmosphere of the substrate processing apparatus 100 may be further provided within the substrate processing apparatus 100 to process the substrate W. The bellows 120 may be connected to one side of an upper portion of the lower fixing ring 37 and one side of a lower portion of an upper fixing ring 34 disposed under the through hole 31 defined in the bottom surface of the chamber body 1. The bellows 120 may have a circular shape. Also, the bellows may be a compressible and extensible member. The bellows is disposed between the upper fixing ring 34 and the lower fixing ring 37 to surround the support shaft 30.

As shown in FIG. 1, the chamber cover 2 is disposed on an upper portion of the substrate processing apparatus 100. The chamber cover 2 covers the chamber body 2 having the opened upper portion to provide an inner space in which the processes with respect to W are performed. A housing 4 may be further provided along an outer surface of the chamber cover 2. A plasma generation apparatus for converting a source gas ($H_2$ or $N_2$) into a radical state may be disposed inside the chamber cover 2. An ICP antenna 70 may be used as the plasma generation apparatus.

The ICP antenna 70 may be connected to an RF generator (not shown) through an input line (not shown). Also, an RF matcher (not shown) may be disposed between the ICP antenna 70 and the RF generator. When RF current is supplied through the RF generator, the supplied RF current is supplied into the ICP antenna 70. The ICP antenna 70 converts RF current into magnetic fields to generate plasma from the source gas supplied into the inner space of the substrate processing apparatus 100.

The source gas is introduced into the inner space of the substrate processing apparatus 100 through a gas supply hole 83 defined in the upper portion of the chamber cover 2. The source gas ($H_2$ or $N_2$) supplied from a first gas storage tank 60 is introduced first through a block plate 80. The block plate 80 is fixed to a ceiling surface of the chamber cover 2. The source gas is filled into a space defined between the chamber cover 2 and the block plate 80 and then is diffused through gas injection holes 81 defined in a bottom surface of the block plate 80.

For example, a cleaning process with respect to the substrate W may be a dry etching process using hydrogen (H*) and $NF_3$ gases which respectively have radical states and in which the plasma process is performed. The etching process may be performed on a silicon oxide formed on a surface of the substrate W. As described above, the primarily diffused hydrogen ($H_2$) is converted into the hydrogen (H*) having the radical state through the ICP antenna 70 to pass through a first shower head 83. The first shower head 83 re-diffuses the hydrogen (H*) having the radical state through a plurality of injection holes 84 thereof. Thus, the hydrogen (H*) may be uniformly diffused downward.

An injection ring 66 is disposed between the chamber cover 2 and the chamber body 1. The injection ring 66 may be formed of an aluminum material. The injection ring 66 is fixedly disposed on a lower end of the chamber cover 2. Also, the injection ring 66 has an injection hole 68. A second gas is received from a second gas storage tank 65 through the injection hole 68 and introduced into the substrate processing apparatus 100. The introduced gas may be nitrogen fluoride ($NF_3$). The nitrogen fluoride ($NF_3$) introduced through the injection hole 68 meets hydrogen (H*) having a radical state between the first shower head 83 and a second shower head 87. Thus, as expressed in the following reaction formula (1), the nitrogen fluoride (NF$_3$) is reduced to generate an intermediate product such as NH$_x$F$_y$ (where x and y are certain integers).

$$H^* + NF_3 \Rightarrow NH_xF_y \quad (1)$$

The intermediate product passes through the second shower head 87 disposed under the injection ring 66 and is moved onto the substrate W. The second shower head 87 has a plurality of injection holes 88 like the first shower head 83. The second shower head re-diffuses the hydrogen (H*) having the radical state and passing through the first shower head 83 and the nitrogen fluoride (NF$_3$) introduced through the injection ring 66 to move the intermediate product onto the substrate W.

Since the intermediate product has high reactivity with silicon oxide (SiO$_2$), when the intermediate product reaches a surface of the silicon substrate, the intermediate product selectively reacts with the silicon oxide to generate a reaction product ((NH$_4$)$_2$SiF$_6$) as expressed in the following reaction formula (2).

$$NH_xF_y + SiO_2 \Rightarrow (NH_4)_2SiF_6 + H_2O \quad (2)$$

Thereafter, when the silicon substrate W is heated at a temperature of about 100° C. or more, the reaction product is pyrolyzed as expressed in the following reaction formula (3) to form a pyrolyzed gas, and then, the pyrolyzed gas is evaporated. As a result, the silicon oxide may be removed from the surface of the substrate. As shown in the following reaction formula (3), the pyrolysis gas includes a gas containing fluorine such as an HF gas or a SiF$_4$ gas.

$$(NH_4)_2SiF_6 \Rightarrow NH_3 + HF + SiF_4 \quad (3)$$

As described above, the cleaning process may include the reaction process for generating the reaction product and the heating process for pyrolyzing the reaction product. The reaction process and the heating process may be performed within the chamber.

Also, the substrate processing apparatus 100 provides the inner space in which the processes are performed. While the processes are performed, the inner space is maintained in a vacuum atmosphere having a pressure less than that of the atmosphere. Also, after the above-described cleaning process is performed, an exhaust port 55 is disposed on one side surface of the chamber body 1 to exhaust the reaction byproducts and non-reaction gases. The reaction product is discharged by an exhaust pump 50 connected to the exhaust port 55.

As described above, the discharge plate and the auxiliary discharge plate are disposed around the heating plate. Also, the support bar 18 supports the discharge plate and the auxiliary discharge plate. Each of the discharge plate and the auxiliary discharge plate has through holes. The reaction byproducts and the non-reaction gases may be moved into the exhaust port through the through holes. As described above, the reaction product and the non-reaction gases may include the radical and reactive gas within a reaction region, the non-reactive radical generation gas, the byproducts generated during the plasmarization, and a carrier gas. The reaction byproducts and the non-reaction gases may be suctioned by the exhaust pump 50 and discharged through an exhaust line (not shown).

Figure 3:
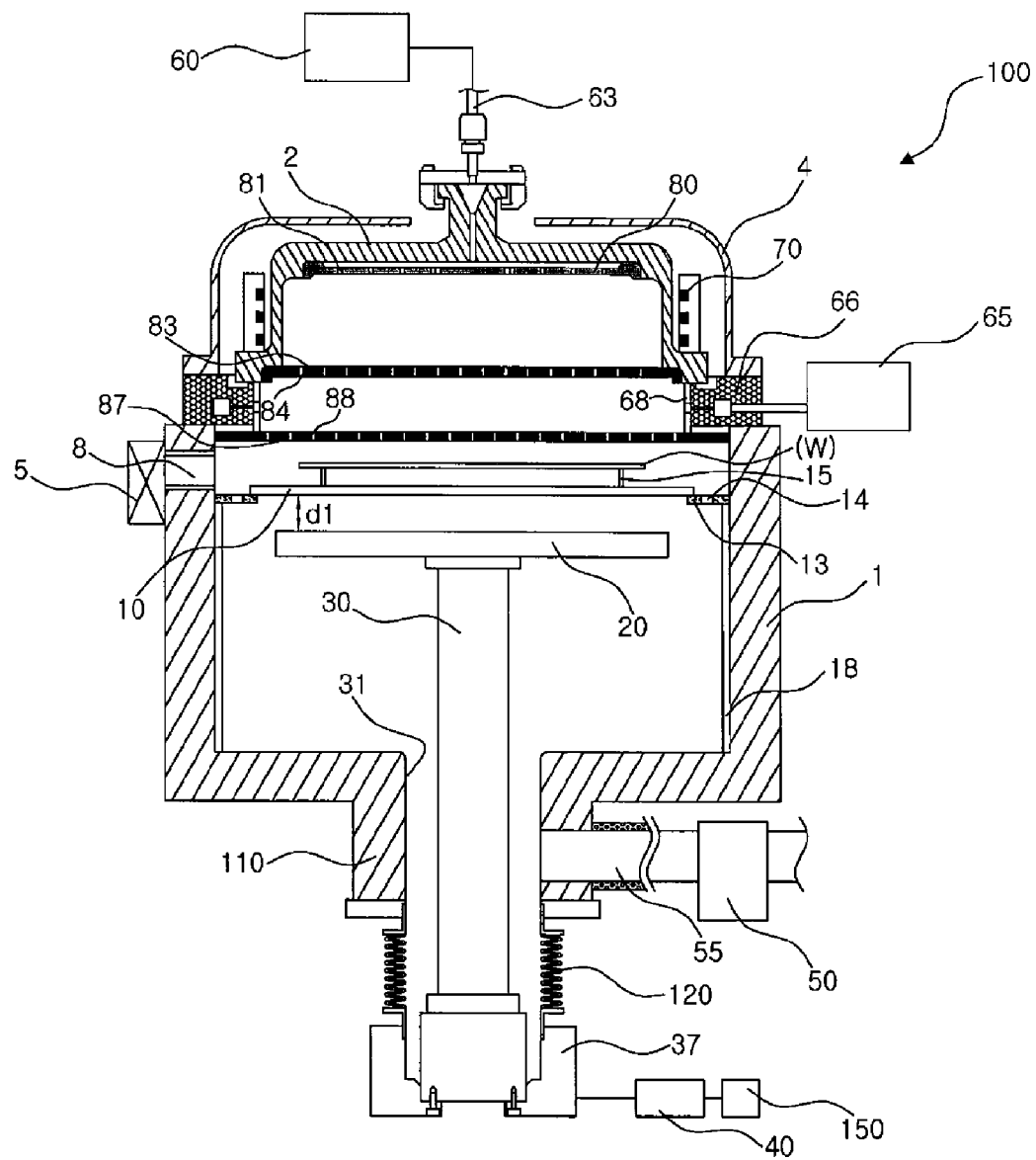
FIG. 3 is a schematic view of a substrate processing apparatus according to another embodiment of the present invention.

FIG. 3 is a schematic view of a substrate processing apparatus according to another embodiment of the present invention. As shown in FIG. 1, the exhaust port 55 may be disposed on one side surface of the chamber body 1. Referring to FIG. 3, the exhaust port 55 may be disposed at a central portion of a chamber body 1. A lower port 110 may be connected to an opened lower portion of the chamber body 1. An exhaust port 55 may be disposed on one side surface of the lower port 90. As described above, the non-reaction gas and reaction product may be forcibly exhausted through an exhaust pump 50 connected to the exhaust port 55.

Although the present invention is described in detail with reference to the exemplary embodiments, the invention may be embodied in many different forms. Thus, technical idea and scope of claims set forth below are not limited to the preferred embodiments.

What is claimed is:

1. A substrate processing apparatus comprising:
    a chamber providing an inner space in which a process with respect to a substrate is performed;
    a heating plate on which the substrate is placed, the heating plate being fixedly disposed within the chamber;
    a heater spaced from a lower portion of the heating plate to heat the heating plate;
    a lift module lifting the heater;
    a discharge plate disposed around the heating plate, the discharge plate being disposed under a substrate entrance passage defined in the chamber;
    a chamber body having an opened upper portion, the chamber body having the substrate entrance passage, through which the substrate is loaded or unloaded, in a side thereof;
    a chamber cover covering the opened upper portion of the chamber body;
    a gas supply hole defined in an upper portion of the chamber cover to supply a first gas;
    an antenna disposed to surround a circumference of the chamber cover to form a magnetic field within the chamber cover, thereby generating plasma from the first gas; and
    an injection ring fixedly disposed between the chamber body and the chamber cover to supply a second gas.

2. The substrate processing apparatus of claim 1, further comprising a plurality of support bars disposed under the discharge plate to support the discharge plate.

3. The substrate processing apparatus of claim 1, wherein the discharge plate is fixedly disposed on an inner wall of the chamber to support the heating plate.

4. The substrate processing apparatus of claim 1, further comprising an auxiliary discharge plate spaced from a lower portion of the discharge plate, the auxiliary discharge plate being fixedly disposed on the inner wall of the chamber.

5. The substrate processing apparatus of claim 1, wherein the lift module comprises:
    a support shaft connected to a lower portion of the heater to support the heater;
    a lower fixing ring fixedly disposed on a lower portion of the support shaft; and
    a driving part lifting the lower fixing ring.

6. The substrate processing apparatus of claim 5, further comprising:
    an upper fixing ring fixedly disposed on a lower wall of the chamber; and
    a bellows connecting the upper fixing ring to the lower fixing ring to maintain an inner space of the chamber in a vacuum state.

7. The substrate processing apparatus of claim 1, wherein the lift module comprises:

a support shaft connected to a lower portion of the heater to support the heater;

a driving part lifting the support shaft; and a control part controlling the driving part according to a heating temperature inputted into the heater to adjust a distance spaced between the heating plate and the heater.

8. The substrate processing apparatus of claim 1, further comprising a plurality of lift pins fixedly disposed on a top surface of the heating plate to support the substrate thereon.

9. The substrate processing apparatus of claim 1, further comprising:

an exhaust port disposed on a sidewall of the chamber body.

10. The substrate processing apparatus of claim 1, further comprising:

a lower port connected to an opened lower portion of the chamber body; and an exhaust port disposed on the lower port.

11. The substrate processing apparatus of claim 1, further comprising:

a first shower head disposed above the injection ring, the first shower head having a plurality of first injection holes; and a second shower head disposed under the injection ring, the second shower head having a plurality of second injection holes.

* * * * *